United States Patent [19]

Cho et al.

[11] 4,400,640
[45] Aug. 23, 1983

[54] TEMPERATURE STABLE CUTS OF QUARTZ

[75] Inventors: Frederick Y. Cho, Scottsdale, Ariz.; Dylan F. Williams, Berkeley, Calif.

[73] Assignee: Motorola Inc., Schaumburg, Del.

[21] Appl. No.: 378,668

[22] Filed: May 17, 1982

[51] Int. Cl.³ .............................................. H01L 41/08
[52] U.S. Cl. .................................. 310/313 A; 310/361
[58] Field of Search ................... 310/360, 361, 313 R, 310/313 A; 333/151, 154, 155, 193

[56] References Cited

U.S. PATENT DOCUMENTS 4,220,888  9/1980  Gagnepain et al. ............ 310/313 A
4,247,835  1/1981  Lewis ............................. 310/313 A

FOREIGN PATENT DOCUMENTS 56-103518  8/1981  Japan .................................. 310/361

Primary Examiner—Mark O. Budd
Attorney, Agent, or Firm—Jonathan P. Meyer; Eugene A. Parsons

[57] ABSTRACT

Temperature stable cuts of quartz comprise the families of doubly rotated cuts defined by (YXwlt) 0/27/138, 7/27/135.5, 15/40/40, 15/30/38, 12.5/35/130 and rotational equivalents thereof. It is found that SAW devices may be fabricated on these cuts which demonstrate a very high degree of temperature stability and which have other characteristics consistent with practical usage. The sensitivity of the stability to variations in the propagation direction, corresponding to the angle psi, is such that it is advantageous to fabricate several input-output transducer pairs, each slightly rotated with respect to the others, and to chose the most stable for actual use.

5 Claims, 5 Drawing Figures

TEMPERATURE STABLE CUTS OF QUARTZ

The Government has rights in this invention pursuant to Contract No. DAAK20-79-C-0275 awarded by the Department of the Army.

FIELD OF THE INVENTION

The present invention relates, in general, to cuts of quartz on which surface acoustic waves propagate with small temperature dependence. More particularly, the invention relates to several families of doubly rotated cuts of quartz which provide temperature stable surface acoustic wave (SAW) propagation and have other properties desirable for SAW devices.

BACKGROUND OF THE INVENTION

The problem of temperature instability of SAW devices is well known. The problem arises due to the temperature dependence of the crystal constants which determine SAW propagation characteristics. A widely used cut of quartz, the ST cut, demonstrates a temperature dependence which is roughly parabolic and which results in a frequency change of several hundred parts per million (ppm) over the temperature range of −45° C. to +140° C. Several other cuts, known as rotated X cuts, suffer a frequency change less than that of the ST cut, but of more than 150 ppm over the same range. It is possible to use temperature stable environments such as ovens to obtain temperature stable SAW performance, but at the cost of size, power and expense. It is also possible to design SAW devices with multiple propagation tracks having different temperature dependencies and to sum the outputs to achieve relatively temperature stable output. This, of course, requires very precise design and fabrication.

SUMMARY OF THE INVENTION

Accordingly, it is an object of the present invention to provide improved temperature stable cuts of quartz.

It is a further object of the present invention to provide cuts of quartz which have very small or zero first, second and third order temperature coefficients of frequency and which are suitable for practical SAW devices.

Yet another object of the present invention is to provide SAW devices fabricated on improved temperature stable cuts of quartz.

Doubly rotated cuts having improved temperature stability are chosen from the group consisting of the families of cuts: (YXwlt) 0/27/138, 7/27/135.5, 15/40/40, 15/30/38, 12.5/35/130 and rotational equivalents thereof. Each family consists of many possible cuts specified by angle values relatively close to the values which are used to denote the family. In addition to a high degree of temperature stability, the cuts are found to have piezoelectric coupling factors, power flow angles, bulk acoustic wave inverse velocity surfaces and fabrication tolerances which are consistent with practical SAW device requirements.

A particular embodiment of the present invention comprises a SAW device fabricated on a quartz substrate chosen from the group consisting of the families of cuts: (YXwlt) 0/27/138, 7/27/135.5, 15/40/40, 15/30/38, 12.5/35/130 and rotational equivalents thereof. While the transducer design of the SAW device is generally conventional, it is advantageous to fabricate several complete devices with slightly different propagation angles on each substrate and to choose the most nearly temperature stable device for actual use. This is due to the fact that temperature stability is highly dependent on the propagation angle, which is determined by mask alignment during fabrication. SAW devices have been fabricated according to the principles of the present invention which exhibit a total frequency change of less than 80 ppm over the temperature range of −45° C. to +140° C.

These and other objects and advantages of the present invention will be apparent to one skilled in the art from the detailed description below taken together with the drawings.

DETAILED DESCRIPTION OF THE INVENTION

Figure 1:
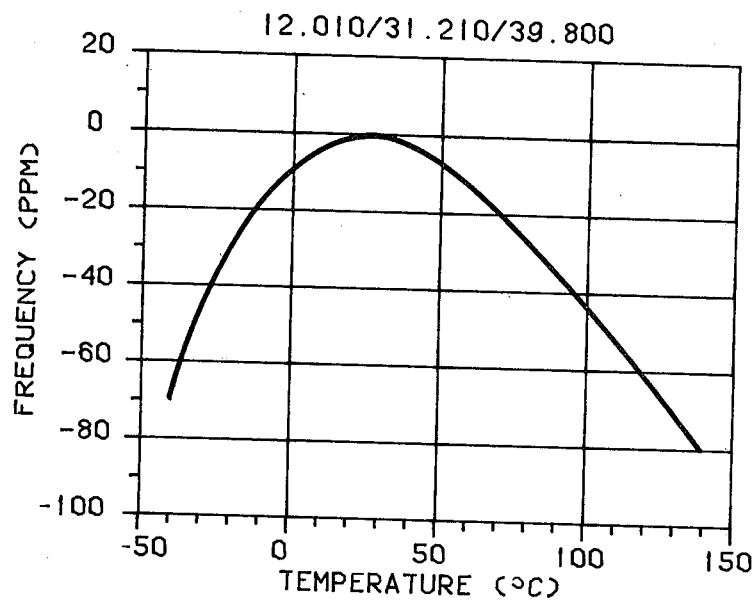
FIG. 1 is a graph of frequency change (in ppm) versus temperature (in degrees C.) for the cut (YXwlt) 12.010/31.210/39.800.

Crystal angles herein are presented in the form (YXwlt) phi/theta/psi and are specified in accordance with "Standards on Piezoelectric Crystals 1949", Proc. IRE 14, December 1949, pages 1378 to 1395.

As is well known in the art, the temperature dependence of surface acoustic wave propagation is commonly described by temperature coefficients of frequency (TCF's). The present invention relates primarily to the first, second and third order coefficients: $TCF^1$, $TCF^2$ and $TCF^3$, respectively. In the three dimensional space defined by the angles phi/theta/psi, five regions have been defined wherein a zero first order coefficient (Zero $TCF^1$) is accompanied by very small $TCF^2$ and $TCF^3$. These regions are referred to herein as families of cuts and each is designated by reference to a particular cut in the region. For instance, one of the families is referred to as: (YXwlt) 0/27/138 and consists of a large number of temperature stable cuts with angle values close to those specified.

As will be apparent to one skilled in the art, a particular direction in a quartz crystal is identical to one or more different directions in the crystal due to symmetries in the crystal structure. The five families of cuts discussed herein are specified in the range $0 \leq phi \leq 30°, -90° \leq theta \leq 90°, 0 \leq psi \leq 180°$. Rotational equivalents of the particular cuts discussed herein, which will fall outside this range, are included in the scope of the present invention.

The five families of cuts described are: (YXwlt) 0/27/138, 7/27/135.5, 15/40/40, 15/30/38, and 12.5/35/130. Table I contains a list of a number of cuts within these families which have a zero first order coefficient. For each cut listed the table contains a calculated value for $TCF^2$ and $TCF^3$. The cuts listed are merely representative and the scope of the present invention is not limited to these cuts. As described above, each of these cuts will have rotational equivalents due to crystal symmetries. From Table I it will be apparent to one skilled in the art that considerable variation in the cut angles is possible while remaining within the temperature stable family.

TABLE I

Progagation Characteristics of Selected Cuts

| Angles of Zero TCF¹ Degrees | | | TCF²/°C.² | TCF³/°C.³ |
|---|---|---|---|---|
| PHI | THETA | PSI | ($\times 10^{-8}$) | ($\times 10^{-10}$) |
| 6 | 26 | 136.31 | −1.4 | |
| 6 | 27 | 135.93 | −1.3 | 0.67 |
| 6 | 28 | 135.59 | −1.3 | 0.57 |
| 7 | 26 | 135.99 | −1.5 | |
| 7 | 27 | 135.64 | −1.4 | |
| 7 | 28 | 135.27 | −1.3 | 0.65 |
| 8 | 26 | 135.74 | −1.4 | 0.65 |
| 8 | 27 | 135.36 | −1.4 | |
| 8 | 28 | 134.97 | −1.3 | |
| 1 | 26 | 137.78 | −1.2 | 0.68 |
| 1 | 27 | 137.48 | −1.2 | 0.65 |
| 1 | 28 | 137.17 | −1.1 | 0.67 |
| 0 | 26 | 138.07 | −1.2 | 0.67 |
| 0 | 27 | 137.78 | −1.1 | 0.68 |
| 0 | 28 | 137.49 | −1.1 | 0.62 |
| −1 | 26 | 138.37 | −1.2 | 0.60 |
| −1 | 27 | 138.09 | −1.2 | 0.62 |
| −1 | 28 | 137.80 | −1.1 | 0.73 |
| 14 | 39 | 40.195 | −1.0 | 0.64 |
| 14 | 40 | 40.415 | −1.0 | 0.66 |
| 14 | 41 | 40.64 | −1.0 | 0.75 |
| 15 | 39 | 39.79 | −1.0 | 0.63 |
| 15 | 40 | 40 | −1.0 | 0.74 |
| 15 | 41 | 40.23 | −1.0 | 0.73 |
| 16 | 39 | 39.4 | −1.0 | 0.68 |
| 16 | 40 | 39.605 | −1.0 | 0.66 |
| 16 | 41 | 39.825 | −1.1 | 0.60 |
| 7.5 | 35.0 | 41.77 | −0.95 | 0.58 |
| 10 | 35 | 40.82 | −0.94 | 0.58 |
| 12.5 | 30 | 38.88 | −0.93 | 0.57 |
| 12.5 | 32.5 | 39.4 | −0.93 | 0.57 |
| 15.0 | 30.0 | 38.12 | −0.93 | 0.57 |
| 15.0 | 32.5 | 38.55 | −0.93 | 0.57 |
| 17.5 | 30.0 | 37.35 | −0.94 | 0.56 |
| 20.0 | 30.0 | 36.6 | −0.97 | 0.55 |
| 22.5 | 30.0 | 35.85 | −1.0 | 0.54 |
| 25.0 | 30.0 | 35.07 | −1.0 | 0.52 |
| 27.5 | 30.0 | 34.28 | −1.1 | 0.50 |
| 7.5 | 35.0 | 132.68 | −1.1 | 0.54 |
| 10.0 | 40.0 | 129.4 | −1.1 | 0.57 |
| 12.5 | 35.0 | 130.62 | −1.0 | 0.41 |
| 12.5 | 42.5 | 127.15 | −1.1 | 0.58 |
| 15.0 | 45.0 | 124.43 | −1.1 | 0.58 |
| 17.5 | 40.0 | 126.14 | −1.1 | 0.54 |
| 20.0 | 40.0 | 124.92 | −1.0 | 0.44 |

Several other propagation characteristics are important for SAW device design. Table II contains a list of selected cuts suitable for temperature stable SAW devices and the corresponding surface acoustic wave velocity, the piezoelectric coupling factor K² and the power flow angle. As is apparent, the velocity effects the length of delay lines, for instance, the coupling constant effects transducer design and the power flow angle effects transducer layout and design.

TABLE II

Progagation Characteristics of Selected Cuts

| Angles of Zero TCF¹ Degrees | | | Velocity | K² | Power Flow Angle |
|---|---|---|---|---|---|
| PHI | THETA | PSI | (M/Sec) | ($\times 10^{-3}$) | (Degrees) |
| 6 | 26 | 136.31 | 3296.84 | 1.12 | −0.3 |
| 6 | 27 | 135.93 | 3293.60 | 1.12 | −0.2 |
| 6 | 28 | 135.59 | 3290.63 | 1.12 | −0.1 |
| 7 | 26 | 135.99 | 3303.33 | 1.12 | −0.5 |
| 7 | 27 | 135.64 | 3299.70 | 1.12 | −0.4 |
| 7 | 28 | 135.27 | 3296.33 | 1.12 | −0.3 |
| 8 | 26 | 135.74 | 3310.15 | 1.12 | −0.7 |
| 8 | 27 | 135.36 | 3306.11 | 1.12 | −0.6 |
| 8 | 28 | 134.97 | 3302.32 | 1.10 | −0.5 |

TABLE II-continued

Progagation Characteristics of Selected Cuts

| Angles of Zero TCF¹ Degrees | | | Velocity | K² | Power Flow Angle |
|---|---|---|---|---|---|
| PHI | THETA | PSI | (M/Sec) | ($\times 10^{-3}$) | (Degrees) |
| 1 | 26 | 137.78 | 3268.80 | 1.10 | +0.7 |
| 1 | 27 | 137.48 | 3267.44 | 1.10 | +0.9 |
| 1 | 28 | 137.17 | 3266.36 | 1.10 | +1.0 |
| 0 | 26 | 138.07 | 3264.09 | 1.12 | +0.9 |
| 0 | 27 | 137.78 | 3263.09 | 1.10 | +1.1 |
| 0 | 28 | 137.49 | 3262.35 | 1.10 | +1.2 |
| −1 | 26 | 138.37 | 3259.65 | 1.10 | +1.1 |
| −1 | 27 | 138.09 | 3259.01 | 1.10 | −1.3 |
| −1 | 28 | 137.80 | 3258.64 | 1.08 | +1.5 |
| 14 | 39 | 40.195 | 3298.60 | 0.96 | −7.7 |
| 14 | 40 | 40.415 | 3306.67 | 0.96 | −8.1 |
| 14 | 41 | 40.64 | 3315.19 | 0.94 | −8.6 |
| 15 | 39 | 39.79 | 3301.82 | 0.96 | −7.8 |
| 15 | 40 | 40.00 | 3310.14 | 0.94 | −8.3 |
| 15 | 41 | 40.23 | 3319.09 | 0.98 | −8.6 |
| 16 | 39 | 39.4 | 3305.38 | 0.96 | −8.0 |
| 16 | 40 | 39.605 | 3314.03 | 0.98 | −8.4 |
| 7.5 | 35.0 | 41.77 | 3262.43 | 1.00 | −4.8 |
| 10 | 35.0 | 40.82 | 3264.23 | 1.01 | −5.3 |
| 12.5 | 30.0 | 38.88 | 3243.27 | 1.01 | −4.1 |
| 12.5 | 32.5 | 39.4 | 3254.49 | 1.00 | −4.9 |
| 15.0 | 30.0 | 38.12 | 3244.99 | 0.98 | −4.6 |
| 15.0 | 32.5 | 38.55 | 3257.82 | 0.98 | −5.3 |

Figure 2:
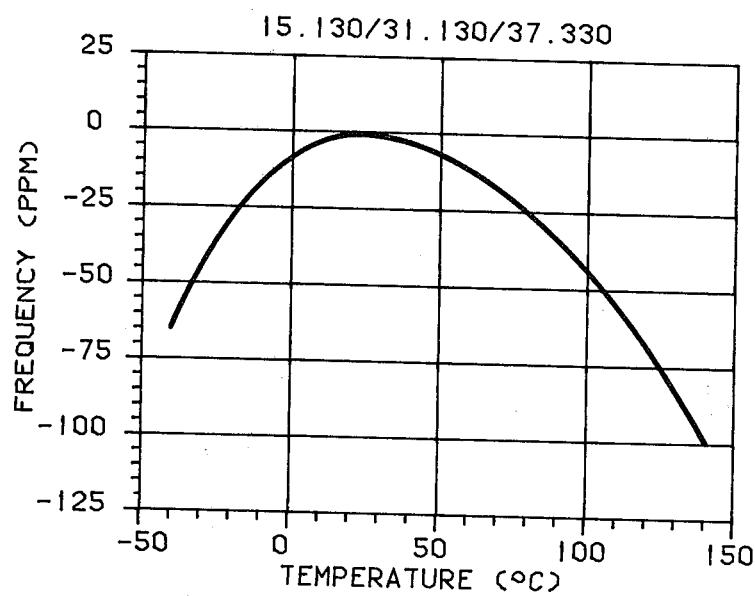
FIG. 2 is a similar graph for the cut (YXwlt) 15.130/31.130/37.330.
Figure 3:
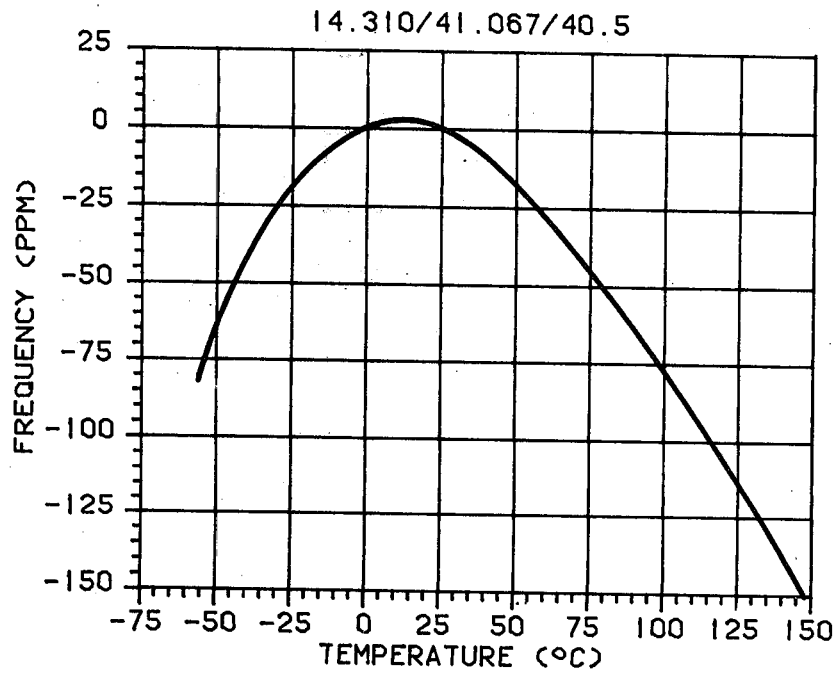
FIG. 3 is a similar graph for the cut (YXwlt) 14.310/41.067/40.5.
Figure 4:
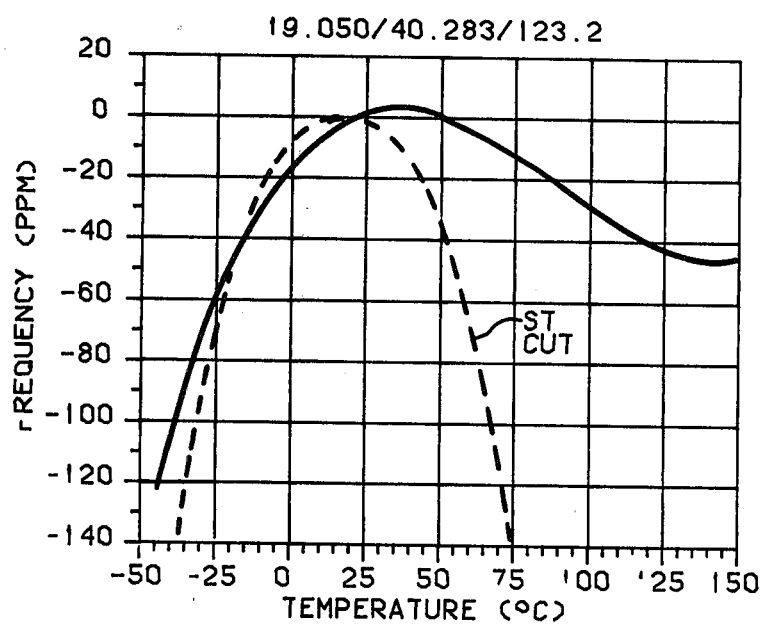
FIG. 4 is a similar graph for the cut (YXwlt) 19.050/40.283/123.2.

Referring now to FIGS. 1, 2, 3 and 4, graphs of the frequency change versus temperature are shown for several representative cuts of quartz. As is standard, the frequency change is expressed in ppm and the temperature in degrees centigrade. FIG. 1 is the graph for the cut (YXwlt) 12.010/31.210/38.800 and represents the most temperature stable cut located to date. This does not preclude the location of more stable cuts in the future, since investigating every possible cut in the stable families is virtually impossible. The total frequency change for this cut is less than 80 ppm over the temperature range −40° C. to 145° C., which is approximately a factor of 2 better than previously reported results. FIGS. 2, 3 and 4 are similar graphs of very stable cuts and FIG. 4 includes a dashed curve representing the graph for the well known ST cut for comparison.

Another important factor in SAW device design is the variation of the TFC's with variations in the cut angles. Table III contains a list of selected cuts and corresponding partial derivative of the first order coefficient, TCF¹, with respect to psi. As is apparent from Table III the extreme sensitivity of TCF¹ to mask alignment, which determines the angle psi, will require very precise fabrication. It is possible, with very careful mask alignment, to attain a high degree of temperature stability. An alternate solution to this problem is discussed below. Table IV contains a list of selected cuts and the corresponding partial derivatives of TCF¹ with respect to phi and theta. The relatively low sensitivity of TCF¹ to variations in phi and theta indicates that practical SAW devices are achieveable with standard fabrication techniques. The derivatives of TCF² and TCF³ do not exhibit characteristics which render practical SAW devices unobtainable.

TABLE III

δTCF¹/δΨ For Selected Cuts

| Angles of Zero TCF¹ Degrees | | | δTCF¹/δΨ |
|---|---|---|---|
| PHI | THETA | PSI | (PPM/C.°)/DEGREE |
| 6 | 26 | 136.31 | +2.7 |
| 6 | 27 | 135.93 | +2.7 |
| 6 | 28 | 135.59 | +2.7 |

TABLE III-continued

$\delta TCF^1/\delta\Psi$ For Selected Cuts

| Angles of Zero TCF$^1$ Degrees | | | $\delta TCF^1/\delta\Psi$ |
|---|---|---|---|
| PHI | THETA | PSI | (PPM/C.°)/DEGREE |
| 7 | 26 | 135.99 | +2.7 |
| 7 | 27 | 135.64 | +2.7 |
| 7 | 28 | 135.27 | +2.7 |
| 8 | 26 | 135.74 | +2.7 |
| 8 | 27 | 135.36 | +2.7 |
| 8 | 28 | 134.97 | +2.7 |
| 1 | 26 | 137.78 | +2.8 |
| 1 | 27 | 137.48 | +2.8 |
| 1 | 28 | 137.17 | +2.8 |
| 0 | 26 | 138.07 | +3.0 |
| 0 | 27 | 137.78 | +3.0 |
| 0 | 28 | 137.49 | +3.0 |
| −1 | 26 | 138.37 | +3.0 |
| −1 | 27 | 138.09 | +3.0 |
| −1 | 28 | 137.08 | +3.0 |
| 14 | 39 | 40.195 | −3.5 |
| 14 | 40 | 40.415 | −3.5 |
| 14 | 41 | 40.64 | −3.5 |
| 15 | 39 | 39.79 | −3.5 |
| 15 | 40 | 40 | −3.5 |
| 15 | 41 | 40.23 | −3.5 |
| 16 | 39 | 39.4 | −3.7 |
| 16 | 40 | 39.605 | −3.7 |
| 16 | 41 | 39.825 | −3.7 |
| 7.5 | 35.0 | 41.77 | −3.3 |
| 10.0 | 35.0 | 40.82 | −3.4 |
| 12.5 | 30.0 | 38.88 | −3.3 |
| 12.5 | 32.5 | 39.4 | −3.2 |
| 15.0 | 30.0 | 38.12 | −3.4 |
| 15.0 | 32.5 | 38.55 | −3.6 |
| 17.5 | 30.0 | 37.35 | −3.4 |
| 20.0 | 30.0 | 36.6 | −3.5 |
| 22.5 | 30.0 | 35.85 | −3.5 |
| 25.0 | 30.0 | 35.07 | −3.3 |
| 27.5 | 30.0 | 34.28 | −3.4 |
| 7.5 | 35.0 | 132.68 | +2.7 |
| 10.0 | 40.0 | 129.40 | +2.8 |
| 12.5 | 35.0 | 130.62 | +2.0 |
| 12.5 | 42.5 | 127.15 | +2.5 |
| 15.0 | 45.0 | 124.43 | +2.6 |
| 17.5 | 40.0 | 126.14 | +2.1 |
| 20.0 | 40.0 | 124.92 | +2.6 |

TABLE IV

$\delta TCF^1/\delta\Psi$ And $\delta TCF^1/\delta\Theta$ For Selected Cuts

| Angles of Zero TCF$^1$ Degrees | | | $TCF^1/\delta\phi$ (PPM/C.°)/ | $\delta TCF^1/\delta\Theta$ (PPM/C.°)/ |
|---|---|---|---|---|
| PHI | THETA | PSI | DEGREE | DEGREE |
| 7 | 27 | 135.64 | −0.7 | −0.5 |
| 0 | 27 | 137.78 | −0.8 | −0.8 |
| 15 | 40 | 40.00 | +1.5 | −0.7 |
| 15.0 | 32.5 | 38.55 | −1.2 | 0.6 |
| 12.5 | 35.0 | 130.62 | 0.95 | 1.1 |

Figure 5:
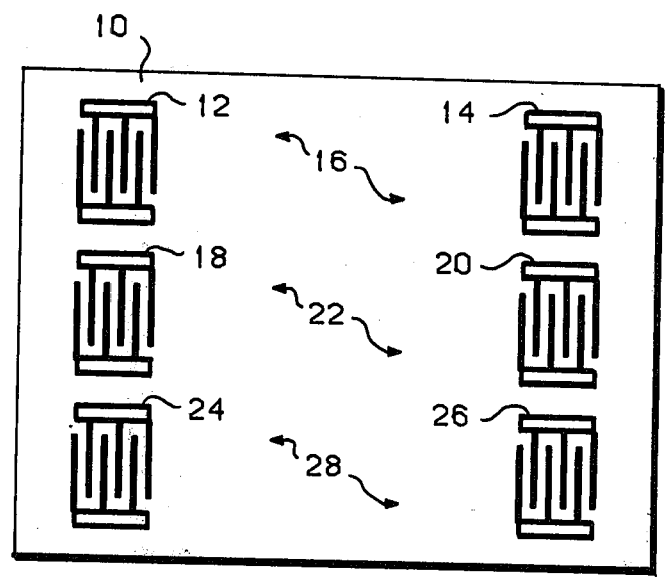
FIG. 5 is a view of a surface acoustic wave device according to the principles of the present invention.

Referring now to FIG. 5 a surface acoustic wave device according to an embodiment of the present invention is shown. A substrate 10 comprises a doubly rotated cut of quartz chosen from the group consisting of the five families of temperature stable cuts described above and rotational equivalents thereof. Double rotated cuts of quartz are available from the Walpey Company and Crystal Technology, among other crystal suppliers. It is found that the accuracy of the cut in the angles phi and theta should be approximately 12 minutes or less to achieve best results. However, as demonstrated by Table III, the sensitivity of TCF$^1$ to variations in psi demands a high degree of accuracy. Since psi is determined by mask alignment with respect to crystal axes which do not necessarily correspond to visible indications on a finished substrate, alignment to within a few minutes is difficult. To solve this problem more than one SAW device may be fabricated on a single substrate. Each device is rotated slightly with respect to the others, therefore increasing the likelihood that one of the devices will be correctly aligned to provide maximum temperature stability. A first Saw device 16 comprises an input transducer 12 and an output transducer 14. Transducers 12 and 14 shown here are intended to be merely representative of the wide variety of surface acoustic wave transducers which are known in the art. Similarly, a second SAW device comprises an input transducer 18 and an output transducer 20 and a third SAW device comprises an input transducer 24 and an output transducer 26. All of the above transducers are fabricated using a single mask so that the alignment difference between the different devices may be precisely controlled. For instance, each succeeding device may be skewed with respect to its neighbor by approximately 0.2° which would of course not be apparent at the scale of FIG. 5. As will be apparent to those skilled in the art, the choice of the number of devices fabricated on a single substrate and the amount of skewing between them admit of a large range of possibilities. After such a device has been fabricated each individual SAW device can be tested for temperature stability and only the most stable one will ultimately be used.

While the method described with reference to FIG. 5 is presently attractive for fabricating temperature stable SAW devices on doubly rotated cuts of quartz, improvements in the ability to align the fabrication masks with respect to the crystal axes may render it obsolete. It is not intended to limit the scope of the present invention to any particular transducer design or method of fabrication.

While the invention has been particularly shown and described with reference to a preferred embodiment thereof, it will be understood by those skilled in the art that various other modifications and changes may be made to the present invention from the principles of the invention described above without departing from the spirit and scope thereof.

We claim:

1. A temperature stable cut of quartz chosen from the group consisting of:
   the families (YXwlt) 0/27/138, 7/27/135.5, 15/40/40, 15/30/38, 12.5/35/130 and rotational equivalents thereof.

2. A surface acoustic wave device comprising:
   a quartz substrate chosen from the group consisting of the families (YXwlt) 0/27/138, 7/27/135.5, 15/40/40, 15/30/38, 12.5/35/130 and rotational equivalents thereof; and
   transducer means on a surface of said substrate for generating surface acoustic waves thereon in response to an electrical input signal and for generating an electrical output signal in response to said surface acoustic waves.

3. A surface acoustic wave device according to claim 2 wherein said transducer means comprises:
   at least two input-output transducer pairs each defining a different propagation direction along said substrate.

4. A surface acoustic wave device according to claim 2 wherein said quartz substrate is defined by (YXwlt) 12.01°/31.21°/39.80°.

5. A temperature stable surface acoustic wave device comprising:

a quartz substrate chosen from the group consisting of the families (YXwlt) 0/27/138, 7/27/135.5, 15/40/40, 15/30/38, 12.5/35/130 and rotational equivalents thereof;

a first input-output transducer pair on said substrate defining a first propagation direction; and at least a second input-output transducer pair on said substrate defining at least a second propagation direction.

* * * * *